US010236905B1

(12) United States Patent
Callanan et al.

(10) Patent No.: US 10,236,905 B1
(45) Date of Patent: Mar. 19, 2019

(54) TIME INTERLEAVED FILTERING IN ANALOG-TO-DIGITAL CONVERTERS

(71) Applicant: Analog Devices Global Unlimited Company, Hamilton (BM)

(72) Inventors: Andreas Callanan, Murroe (IE); Adrian Sherry, Raheen (IE); Gabriel Banarie, Murroe (IE); Colin G. Lyden, Baltimore (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/901,177

(22) Filed: Feb. 21, 2018

(51) Int. Cl.
*H03M 1/06* (2006.01)
*H03M 3/00* (2006.01)
*H03H 17/02* (2006.01)

(52) U.S. Cl.
CPC .......... *H03M 3/34* (2013.01); *H03H 17/0219* (2013.01); *H03M 3/496* (2013.01)

(58) Field of Classification Search
CPC .... H03M 1/0626; H03M 1/066; H03M 3/346; H03M 3/392; H03M 3/502; H03M 3/504; H03M 1/1215; H03M 1/1038; H03M 1/12; H03M 1/124; H03M 3/462
USPC .................. 341/118, 120, 141, 142, 143, 155
See application file for complete search history.

(56) References Cited

U.S. PATENT DOCUMENTS

| 4,881,241 A * | 11/1989 | Pommier | H04H 20/72 375/260 |
| 5,039,989 A | 8/1991 | Welland et al. | |
| 5,675,334 A | 10/1997 | McCartney | |
| 6,154,497 A * | 11/2000 | Gatherer | H03M 3/37 327/146 |
| 6,208,279 B1 * | 3/2001 | Oprescu | H03M 3/374 341/143 |
| 8,633,843 B2 | 1/2014 | Ceballos et al. | |
| 9,143,147 B1 | 9/2015 | Ray et al. | |
| 2005/0156769 A1 | 7/2005 | O'Dowd et al. | |
| 2009/0051577 A1 * | 2/2009 | Rzehak | H03M 3/474 341/143 |
| 2010/0295716 A1 * | 11/2010 | Yamaki | H03M 1/0827 341/155 |
| 2011/0210880 A1 * | 9/2011 | Hainz | H03M 1/1225 341/141 |
| 2012/0281784 A1 * | 11/2012 | Beydoun | H03M 1/1028 375/295 |
| 2013/0176068 A1 * | 7/2013 | Yamamoto | G06G 7/04 327/362 |
| 2015/0162935 A1 * | 6/2015 | Aaltonen | H03M 3/368 341/143 |
| 2017/0201236 A1 * | 7/2017 | Kajita | H03M 3/02 |
| 2017/0310338 A1 * | 10/2017 | Hori | H03F 3/217 |

OTHER PUBLICATIONS

Manganaro, Gabriele, et al., "Interleaving ADCs: Unraveling the Mysteries", Analog Dialogue 49-07, (Jul. 2015), 5 pgs.

* cited by examiner

*Primary Examiner* — Linh V Nguyen
(74) *Attorney, Agent, or Firm* — Schwegman Lundberg & Woessner, P.A.

(57) ABSTRACT

Techniques to increase a data throughput rate of a filter circuit by preloading selectable memory circuits of the filter circuit with reference data, sampling input data at an input of the filter circuit, combining the sampled input data with the preloaded reference data, and generating a filter output based on the combined sampled input data and preloaded reference data.

20 Claims, 12 Drawing Sheets

TIME INTERLEAVED FILTERING IN ANALOG-TO-DIGITAL CONVERTERS

FIELD OF THE DISCLOSURE

This document pertains generally, but not by way of limitation, to integrated circuits, and more particularly, to analog-to-digital converter (ADC) circuits.

BACKGROUND

A typical analog-to-digital converter (ADC) circuit chops an input analog signal by swapping a positive and a negative polarity of a differential signal at an input of the ADC periodically to reduce or eliminate an effective DC voltage bias (e.g., voltage offset) at the analog input. Chopping is typically periodic with both a non-inverted phase (Chop0) and an inverted phase (Chop1) having a fixed and equal sampling time. By summing the two previous chop phase analog to digital conversion results at the end of each switch inversion, voltage offset contributions through the ADC (chopped path), may be cancelled. This summing is typically done as part of the digital filtering in a delta-sigma ADC architecture.

A consequence of chopping is that a settling time of a filter within the ADC may be increased (e.g., typically doubled). A further consequence of chopping is that once the filter has settled, the effective settled throughput may be reduced by typically a factor N where N represents the order of the digital filter, thereby reducing an effective data throughput of the ADC accordingly.

SUMMARY OF THE DISCLOSURE

This disclosure describes various techniques to increase a data throughput rate of a filter circuit. For example, in some aspects, this disclosure describes techniques to provide system chopped data output at the unchopped data output rate for, but not restricted to, filters, including but not limited to, Sinc filters. As described in detail below, each of the stages of a filter circuit, e.g., Sinc filter, can include two or more selectable storage elements, e.g., registers, to store data derived or generated from filter states, e.g., current or past states, of the respective integrator or differentiator stage. At a given time, the filter can select past states of the filter by preloading selectable memory circuits of the filter with past state data, or reference data, to generate an output. In the case of a first output there typically will be no past state data and typically the initial state data (signal information) is fixed, e.g., zero. After a first output, data can be stored and represent past state data for any future output.

In some aspects, this disclosure is directed to a method of increasing a data throughput rate of a filter circuit. The method comprises preloading selectable memory circuits of the filter circuit with reference data, sampling input data at an input of the filter circuit, combining the sampled input data with the preloaded reference data, and generating a filter output based on the combined sampled input data and preloaded reference data.

In some aspects, this disclosure is directed to an analog-to-digital converter (ADC) circuit for increasing a data throughput rate of a filter. The ADC circuit comprises a digital filter circuit configured to receive input data at an input, the digital filter circuit including N filter stages, wherein each of the N filter stages includes selectable memory circuits configured to store data; and a controller circuit coupled to the filter circuit and configured to: preload the selectable memory circuits of the filter circuit with reference data; sample the input data at the input of the filter circuit; combine the sampled input data with the preloaded reference data; and generate a filter output based on the combined sampled input data and preloaded reference data.

In some aspects, this disclosure is directed to an analog-to-digital converter (ADC) circuit for increasing a data throughput rate of a filter. The ADC circuit comprises means for preloading selectable memory circuits of the filter circuit with reference data, means for sampling input data at an input of the filter circuit, means for combining the sampled input data with the preloaded reference data, and means for generating a filter output based on the combined sampled input data and preloaded reference data.

This overview is intended to provide an overview of subject matter of the present patent application. It is not intended to provide an exclusive or exhaustive explanation of the invention. The detailed description is included to provide further information about the present patent application.

Figure 1:
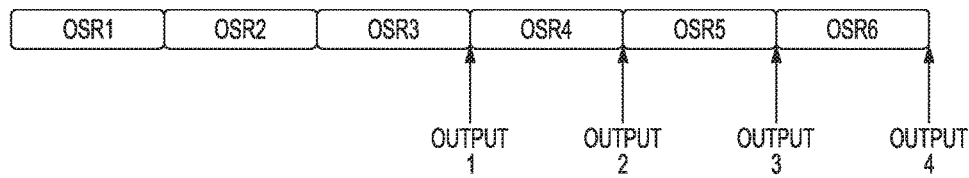
FIG. 1 is a conceptual diagram depicting a settled data output rate for an unchopped configuration with a $Sinc^3$ decimation filter with an oversampling rate of OSR.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As indicated above, consequences of chopping can include increased settling time of a filter within the analog-to-digital converter (ADC) circuit (also referred to in this disclosure as an "ADC") and reduced throughput, thereby reducing an effective data throughput of the ADC accordingly. As described in detail below, various techniques of this disclosure can provide the benefits of system chopping and mitigate for the reduction in effective throughput of a chopped ADC.

A delta-sigma modulator-based analog to digital converter (ADC) system can include a Sinc decimation filter with an oversampling rate (e.g. decimation rate), OSR. For a typical $N^{th}$ order Sinc decimation filter (e.g., a third order filter may be designated as a "Sinc$^N$" filter with N=3, and a fourth order filter may be designated as a Sinc$^N$ filter with N=4), N×OSR samples are filtered prior to full settling of the filter output, assuming a direct current (DC) input. In such a delta-sigma modulator based ADC, when the filter has settled, consecutive settled outputs may be available after each 1×OSR samples, again assuming a DC input.

In various examples, the first settled output cannot be available until after N×OSR samples, but thereafter new settled outputs can be available every 1×OSR samples after the prior new settled output.

Chopping may be employed for the purposes of removing low frequency noise and DC offsets whereby each chop cycle utilizes fully settled filter outputs. Thus, the effective data output rate of the ADC system may be reduced by 1/N for an Nth order Sinc filter.

Furthermore, when the ADC system is chopped, the settling period of the ADC is doubled to 2×N×OSR samples, e.g., two fully settled conversion results, effectively doubling the settling time of ADC system and reducing the settled data rate by a factor of N. In various examples, the first settled output cannot be available until after 2×N×OSR samples since the start of the first chop phase. Therefore, if the system is chopped after every N×OSR samples, new settled outputs can be available every N×OSR samples after the prior new settled output.

Examples of an ADC system as described herein effectively provide settled chopped data output rates that are equivalent to unchopped data output rates for, but not limited to, such Sinc filters. Filters are often split into separate stages. By splitting the filter into numerous separate stages, with one stage per order of the filter, and providing a delay register between the stages, the effective output data rate can be reduced to that of a single stage (1$^{st}$ Order) digital filter. It should be noted that the output, e.g., of a delta-sigma modulator, can a single or multi-bit.

For an Nth order Sinc decimation filter (or "Sinc$^N$" decimation filter) with an oversampling rate of OSR, (N×OSR) samples are needed for full settling of the filter output (assuming a DC input). When such a system is chopped, the settling period extends to 2×(N×OSR) samples, two fully settled conversion results.

System chopping attempts to remove the converter offset contribution in the signal path by alternately switching the polarity of (inverting), the converter input/output in the presence of an offset voltage (Vos). The chopping phase where the input is sampled without input/output inversion can be referred to as "Chop0", and the chopping phase where the input is sampled with the input/output inverted can be referred to as "Chop1". The chopping can be typically applied sequentially and periodically with both Chop0 and Chop1 phases having a predetermined, e.g., user programmable by the OSR selected, and equal sampling time. At the end of each switch inversion, the two previous chop phase conversion results are summed such that the offset voltage Vos is cancelled out. A description of an implementation of such a chop scheme used in a sigma delta converter is described in commonly assigned U.S. Pat. No. 5,675,334 to Damien McCartney, the entire contents of which being incorporated herein by reference.

One of the disadvantages of such chopping schemes is due to their implementation and the settling time requirements of the Sinc decimation filter, the effective chopped data output rate of the system is reduced by 1/N for a Sinc$^N$ filter, and the settling time is doubled, when compared to the unchopped data output rate respectively. This disclosure describes various techniques to provide system chopped data output at the unchopped data output rate for, but not restricted to, filters, including but not limited to, Sinc filters.

FIG. 1 is a conceptual diagram depicting a settled data output rate for an unchopped configuration with a Sinc$^3$ decimation filter with an oversampling rate of OSR. A Sinc$^N$ filter has settled after (N×OSR) cycles, e.g., 3×OSR for the Sinc$^3$ filter depicted, with the first settled output ("Output1") being available at this point and thereafter successive settled outputs are available at the OSR sample rate, e.g., after each subsequent OSR.

As a third order filter, each output used the previous three OSR sample sets to generate the current output. For example, input data from OSR1, OSR2, OSR3 were used to generate Output1, input data from OSR2, OSR3, OSR4 were used to generate Output2, input data from OSR3, OSR4, OSR5 were used to generate Output3, and input data from OSR4, OSR5, OSR6 were used to generate Output4. As illustrated in FIG. 1, settled outputs are available after (N×OSR) cycles for an unchopped Nth order Sinc filter and after each subsequent OSR cycle.

Figure 2:
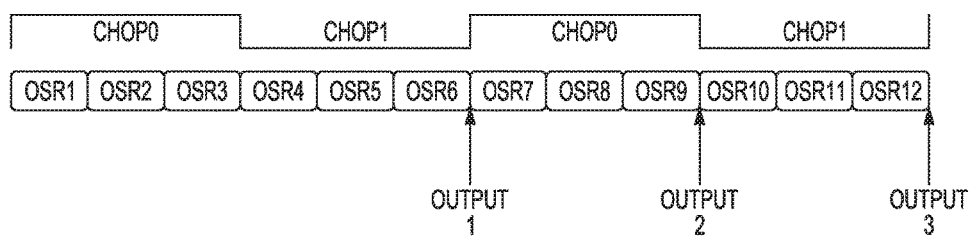
FIG. 2 is a conceptual diagram depicting a settled data output rate for a chopped configuration with a $Sinc^3$ decimation filter with an oversampling rate of OSR.

FIG. 2 is a conceptual diagram depicting a settled data output rate for a chopped configuration with a Sinc$^3$ decimation filter with an oversampling rate of OSR. For the chopped configuration illustrated by FIG. 2, the first settled output "Output1" takes 2×(3×OSR) cycles to settle. Although the second settled output "Output2" needs 2×(3×OSR) cycles to settle, the previous (3×OSR) data can be reused in combination with current (3×OSR) data to generate Output2 after (3×OSR) cycles.

For example, at the time Output2 is generated, the data from OSR1, OSR2, OSR3 will have been flushed from the system with the data generating Output2 coming from [OSR4, OSR5, OSR6/OSR7, OSR8, OSR9]. Similarly, at the time Output3 is generated, the data from OSR4, OSR5, OSR6 will have been flushed from the system with the data generating Output3 coming from [OSR7, OSR8, OSR9/OSR10, OSR11, OSR12]. As illustrated in FIG. 2, the first settled output is available after 2×(N×OSR) cycles for a chopped Nth order Sinc filter and after each subsequent (N×OSR) cycles.

This disclosure describes various techniques to provide system chopped data output at the unchopped data output rate for, but not restricted to, filters, including but not limited to, Sinc filters. As described in detail below, this disclosure describes various techniques to reduce a settling time of a filter circuit by preloading selectable memory circuits of the filter circuit with reference data, sampling input data at an input of the filter circuit, combining the sampled input data with the preloaded reference data, and generating a filter output based on the combined sampled input data and preloaded reference data. The filter can receive a signal to select particular reference data associated with a previous input configuration, e.g., an input channel or a chop state, to preload.

In some examples, the signal can be a chop signal or a chop phase, e.g., binary signal. In some examples, the previous input configuration can be a channel of an input multiplexer circuit. For example, a controller circuit can control selection and operation of any channels and/or switches, e.g., chop switches, and can associate data acquired after the selection and operation with that channel and/or switch configuration. The controller circuit can then store the data and association. An example technique is shown conceptually in FIG. 3.

Figure 3:
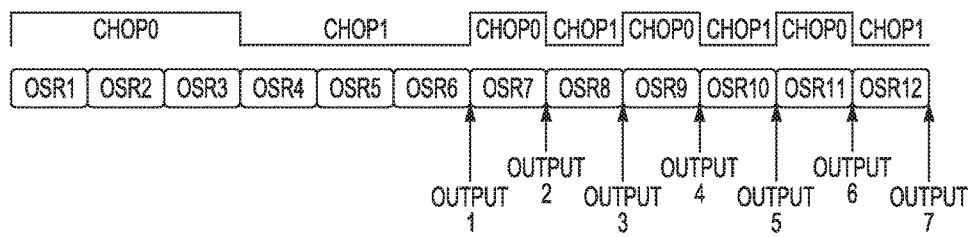
FIG. 3 is a conceptual diagram depicting an example of an unchopped data output rate for a chopped configuration with a $Sinc^3$ decimation filter with an oversampling rate of OSR, in accordance with this disclosure.

FIG. 3 is a conceptual diagram depicting an example of an unchopped data output rate for a chopped configuration with a Sinc$^3$ decimation filter with an oversampling rate of OSR, in accordance with this disclosure. In FIG. 3, the first settled output Output1 is determined similar to what was shown and described above in FIG. 2, where the first Output1 takes 2×(3×OSR) cycles to settle.

In accordance with this disclosure, rather than waiting another (N×OSR) cycles for Output2 (as in FIG. 2), Output2 (of FIG. 3) can be generated from a past filter state, or reference data. In the example shown in FIG. 3, the data from the filter state can be from a similar previous state, e.g., similar chop phase. Output2 (of FIG. 3) can be generated using OSR samples from a first interval, e.g., Chop0, and from a second interval, e.g., Chop1. More particularly, using the techniques of this disclosure, Output2 (of FIG. 3) can be generated by combining sampled input data at an input of the filter, e.g., current data, from OSR7 (of FIG. 3) with preloaded reference data, e.g., past data, from OSR2, OSR3, all from a similar previous state, e.g., Chop0, and data from OSR4, OSR5, OSR6. In other words, Output2 (of FIG. 3) can be generated using [OSR2, OSR3, OSR7/OSR4, OSR5, OSR6], with data from OSR1 replaced by data from OSR7.

In this manner, filter outputs can be generated based on a combination of sampled input data and preloaded reference data.

Using these techniques, a subsequent chopped output "Output3" (of FIG. 3) is available after another OSR cycle, where Output3 can be generated using [OSR2, OSR3, OSR7/OSR5, OSR6, OSR8], with data from OSR4 replaced by data from OSR8. Chopped output "Output4" is available after another OSR cycle, where Output4 can be generated using [OSR3, OSR7, OSR9/OSR5, OSR6, OSR8], with data from OSR2 replaced by data from OSR9. Chopped output "Output5" is available after another OSR cycle, where Output5 can be generated using [OSR3, OSR7, OSR9/OSR6, OSR8, OSR10], with data from OSR5 replaced by data from OSR10. Chopped output "Output6" is available after another OSR cycle, where Output6 can be generated using [OSR7, OSR9, OSR11/OSR6, OSR8, OSR10], with data from OSR3 replaced by data from OSR11. Chopped output "Output7" is available after another OSR cycle, where Output7 can be generated using [OSR7, OSR9, OSR11/OSR8, OSR10, OSR12], with data from OSR6 replaced by data from OSR12, and so forth.

Using the techniques of FIG. 3, the settled chopped data output rate can be the same as the unchopped data output rate, e.g., after each OSR cycle. As indicated above, 2×(N×OSR) cycles are still needed to fully settle Output1. But, in this scheme it is still the previous 2×(N×OSR) samples period data sets that are used to generate the next output, which is similar to the scheme of FIG. 2.

As described in detail below, each of the one or more integrator and differentiator stages of a filter circuit (also referred to as a filter in this disclosure), e.g., Sinc filter, can include two or more selectable storage elements, e.g., registers, to store data derived or generated from filter states, e.g., current or past states, of the respective integrator or differentiator stage. At a given time, the filter can select past states of the filter by preloading selectable memory circuits of the filter with past state data, or reference data, to generate an output. In the case of a first output there typically will be no past state data and typically the initial state data (signal information) is fixed, e.g., zero. After a first output, data can be stored and represent past state data for any future output.

For example, as described above with respect to FIG. 3, to determine Output2, for Chop0 data OSR7, the filter can select past Chop0 states OSR2, OSR3 and use those states along with Chop1 states OSR4, OSR5, OSR6 to determine Output2. Similarly, to determine Output3, for Chop1 data OSR8, the filter can select past Chop1 states OSR5, OSR6 and use those states along with Chop0 states OSR2, OSR3, OSR7 to determine Output8. In this manner, the filter can achieve a chopped output data rate that is the same as when chop is turned off at the OSR rate.

Figure 4:
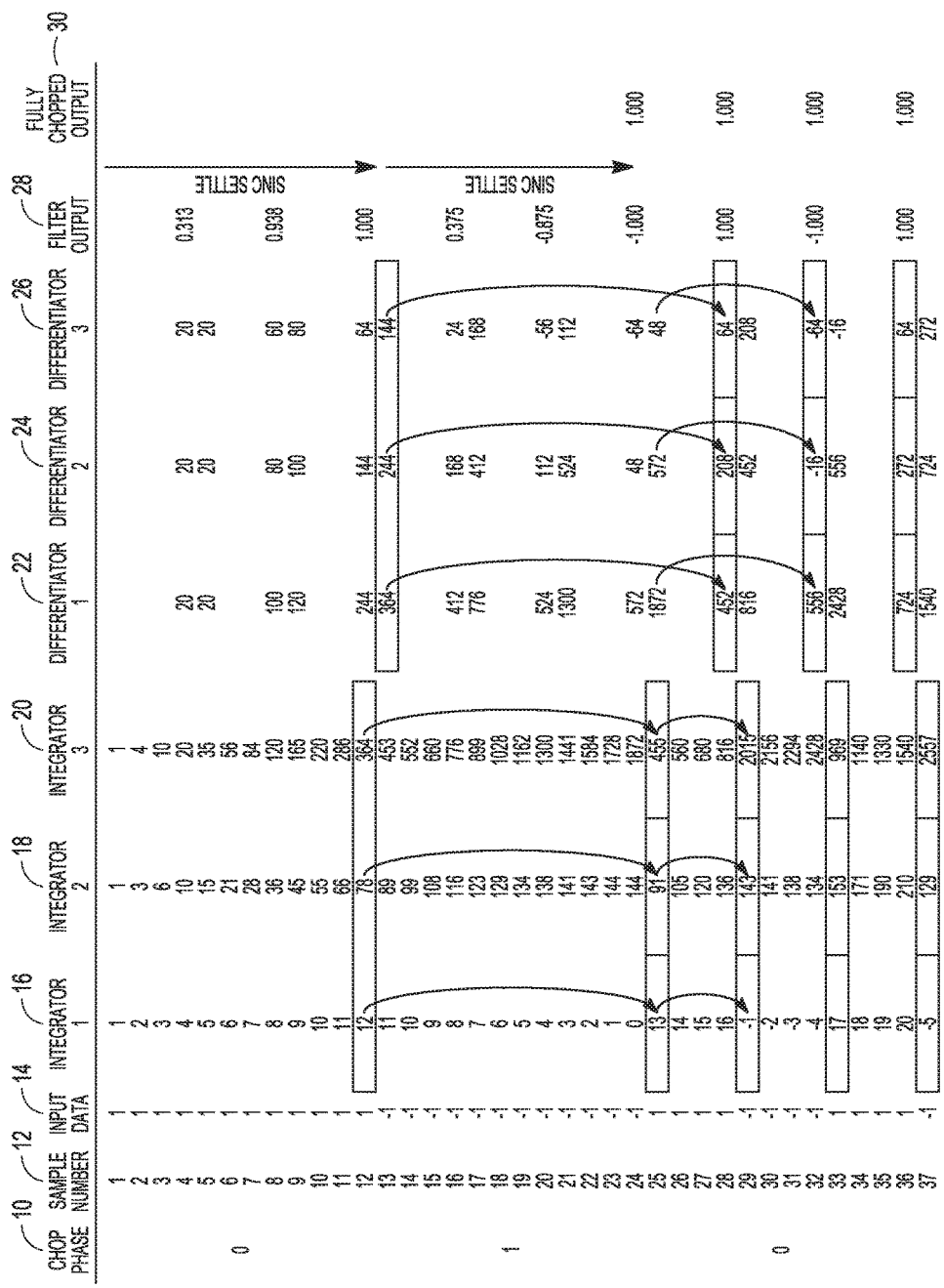
FIG. 4 is a table depicting the internal computations of an example filter implementing various techniques described with respect to FIG. 3.

FIG. 4 is a table depicting the internal computations of an example filter implementing various techniques described with respect to FIG. 3. The non-limiting example in FIG. 4 is for conceptual purposes. FIG. 4 depicts the internal computations of a third order Sinc decimation filter (or "Sinc$^3$" filter) with an OSR equal to 4. From left to right in FIG. 4, column 10 is the chop phase (with chopping simulated by toggling the input between −1 and +1), column 12 is the sample number, and column 14 is the sampled digital input data, where negative full scale is −1, positive full scale is +1 and midscale is 0. For simplicity in this example, the input is made to 100% full scale so that the filter output (column 10) settles to 1.000. Columns 16-20 are integrator 1, integrator 2, and integrator 3 states, respectively, columns 22-26 are differentiator 1, differentiator 2, and differentiator 3 states, respectively, column 28 is the filter output, and column 30 is the fully chopped filter output.

As seen for sample number 1 with input data "1" and chop phase 0, each of integrators 1-3 have a state of "1". For sample number 2, integrator 1 increases its previous state by 1 to "2", integrator 2 increases its previous state using the current output of integrator 1 ("2") and becomes "3", and integrator 3 increases its previous state using the current output of integrator 3 ("3") and becomes "4". For sample number 3, integrator 1 increases its previous state by 1 to "3", integrator 2 increases its previous state using the current output of integrator 1 ("3") and becomes "6", and integrator 3 increases its previous state using the current output of integrator 2 ("6") and becomes "10". For sample number 4, integrator 1 increases its previous state by 1 to "4", integrator 2 increases its previous state using the current output of integrator 1 ("4") and becomes "10", and integrator 3 increases its previous state using the current output of integrator 2 ("10") and becomes "20".

Now, at sample 4, the differentiators are active and a filter output is realized. For sample 4, differentiators 1-3 each have an initial state of "20", based on the output of integrator 3. As seen in column 28, a first filter output is available after 4 samples, and equals the output of differentiator 3 divided by 12. Similarly, as seen in column 28, a second filter output is available after 8 samples. Finally, after 12 samples, or (N×OSR) samples, a settled filter output of 1.000 is produced.

Next, for chop phase 0 and input data "1", integrator and differentiator states can be determined in a manner similar to what was described above, resulting in filter outputs after 16 samples, 20 samples, and 24 samples, where the filter output at sample 24 is fully chopped and settled.

Now, using the techniques described above with respect to FIG. 3, reference data from the previous states of integrators 1-3 and differentiators 1-3 can be preloaded into selectable memory circuits of integrators 1-3 and differentiators 1-3 to quickly settle the chopped output. For example, sample 25 has input data "1" and chop phase 0. The filter can preload selectable memory circuits of integrators 1-3 using previous state information or reference data from a chop phase 0.

As shown in FIG. 4, at sample 25, a controller circuit (shown at 108 in FIG. 8) can retrieve and preload the states (reference data) of integrators 1-3 with the states of integrators 1-3 at sample 12, which was when the filter output in column 28 was last settled for a Chop0 phase. That is, instead of overwriting all the previous reference data, the controller circuit (or "controller") can select previous states (reference data) of integrators 1-3 associated with a similar chop phase, for example, retrieve the selected states (reference data) from associated memory circuits, e.g., registers, and preload the integrators 1-3 with those states (reference data).

In addition, using the techniques of this disclosure, the chopping scheme can be adjusted to update the next output after just one additional OSR. As mentioned above, for the $3^{rd}$ order Sinc decimation filter with an OSR of 4, 12 samples are needed for full settling of the filter output. When the system is chopped as in FIG. 4, the settling period extends to 24 samples and each chopped output requires 12 samples. However, using the techniques of this disclosure, the chopping scheme can be adjusted to chop every 4 samples (e.g., Chop0 phase for samples 25-28, Chop1 phase for samples 29-32, Chop0 phase for samples 33-36, etc.)

For example, at sample 25 and input data "1", the controller circuit (shown at 108 in FIG. 8) can combine the sampled input data to the preloaded reference data of "12" from integrator 1 of sample 12 to produce "13", add the output of integrator 1 to the preloaded state of "78" from integrator 2 of sample 12 to produce "91", and add the output data of integrator 2 to the preloaded state of "364" from integrator 3 of sample 12 to produce "455". Similarly, the controller can preload the states (data) of differentiators 1-3 at sample 28 with the states of differentiators 1-3 at sample 13, which was when the output in column 28 was last settled for a Chop0 phase. In this manner, the filter can combine sampled input data with the preloaded reference data and generate a filter output based on the combined sampled input data and preloaded reference data.

Using the preloaded reference data, the filter can produce a fully chopped settled output at sample 28, after just one additional OSR (instead of the 3 OSR needed to produce an output at sample 12 or at sample 24). In this manner, the filter has produced a fully chopped settled output after only one more OSR sample set, e.g., 4 samples in this example where OSR is 4.

After one more OSR sample set, the filter can produce another fully chopped settled output at sample 32 by preloading the states (data) of integrators 1-3 with the states of integrators 1-3 at sample 24, which was when the output in column 28 was last settled for a Chop1 phase, and preloading the states (data) of differentiators 1-3 at sample 32 with the states of differentiators 1-3 at sample 25, which was when the output in column 28 was last settled for a Chop1 phase.

Additional fully chopped settled outputs can be produced after each subsequent OSR sample set, e.g., 4 samples in this example where OSR is 4, by preloading the integrators and differentiators in the manner described above. Using these techniques, the filter can achieve a chopped output data rate that is the same as when chopping is turned off at the same oversampling rate.

The techniques shown and described above with respect to FIGS. 3 and 4 are not limited to implementations that utilize chopping, however. Rather, regardless of whether chopping is used, the settled filter output data rate can be increased by preloading the filter initial state from a known state using historical data. That is, even with chopping turned off, the filter output of a $Sinc^N$ filter can settle after N sets of OSR samples and then provide the next settled output after 1×OSR samples when the filter is preloaded with the data from (N−1) previous samples.

For example, even if the implementation depicted FIG. 4 were modified to remove the use of chopping (shown in column 10), a controller can still retrieve and preload the states (reference data) of integrators 1-3 and differentiators 1-3. As an example, a controller can retrieve and preload the states of integrators 1-3 at sample 13 with the states of integrators 1-3 at sample 12, which was when the output in column 28 was last settled. Similarly, the controller can retrieve and preload the states of differentiators 1-3. In this manner, the filter output of a $Sinc^N$ filter that does not use chopping can settle after N sets of OSR samples and then provide the next settled output after 1×OSR samples when the filter is preloaded with the data from (N−1) previous (N−1) samples.

Figure 5:
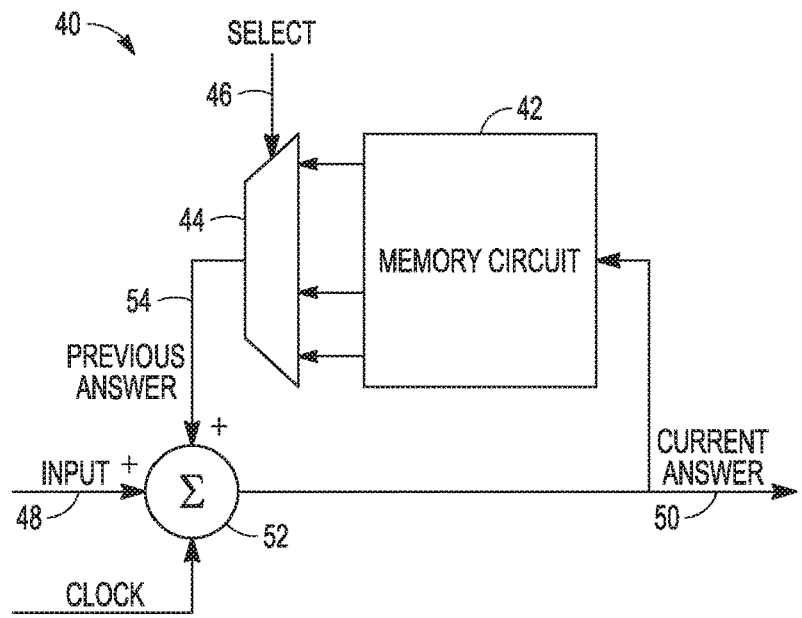
FIG. 5 is a block diagram of an example of an integrator that can implement various techniques of this disclosure.

FIG. 5 is a block diagram of an example of an integrator 40 that can implement various techniques of this disclosure. The action of integrator 40 is depicted in FIG. 4. In contrast to existing integrator designs in which all previous states or reference data are basically over-written, the integrator 40 can include a memory circuit 42 that can store data from two or more previous states and a multiplexer 44 that can receive a select signal 46 from a controller and select a particular state or reference data from the memory circuit 42. In this manner, the controller can select past states of the filter at any given time. The integrator 40 can receive sampled input data 48, receive the select signal 46, retrieve and preload the reference data from the memory circuit 42, e.g., the state of integrator 1 of sample 12 in the non-limiting example shown in FIG. 4, and combine the sampled input data 48 and the preloaded reference data 54 using summing circuit 52 to produce a current state or answer 50 that can be used by the controller to generate a filter output based on the combined sampled input data and preloaded reference data.

Figure 6:
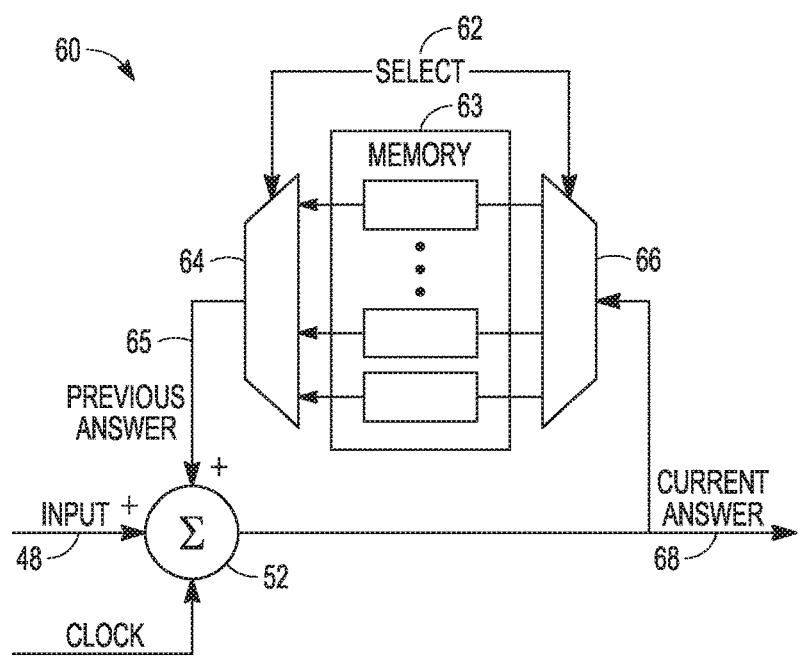
FIG. 6 is a block diagram of another example of an integrator that can implement various techniques of this disclosure.

FIG. 6 is a block diagram of another example of an integrator 60 that can implement various techniques of this disclosure. The integrator 60 can include a memory circuit 63 that can store data from N previous states in memory elements 1 through memory element N. For example, memory element 1 can store/represent Chop0 phase(s) state and memory element 2 can store/represent Chop1 phase(s) state. This is not restricted to chop phases; memory elements may contain previous state data associated with different input channels to the ADC. The select signal 62 can control the chop phase selection and where applicable, the respective input channel. The integrator 60 can include multiplexers 64, 66 that can receive the select signal 62 from a controller and select a particular state from the memory circuit 63. The integrator 60 can receive sampled input data 48, receive the select signal 62, retrieve and preload the reference data from the memory circuit 63, e.g., the state of integrator 1 of sample 12 in the non-limiting example shown in FIG. 4, and combine the sampled input data 48 and the preloaded reference data 65 using the summing circuit 52 to produce a current state or answer 68 that can be used by the controller to generate a filter output based on the combined sampled input data and preloaded reference data.

Figure 7:
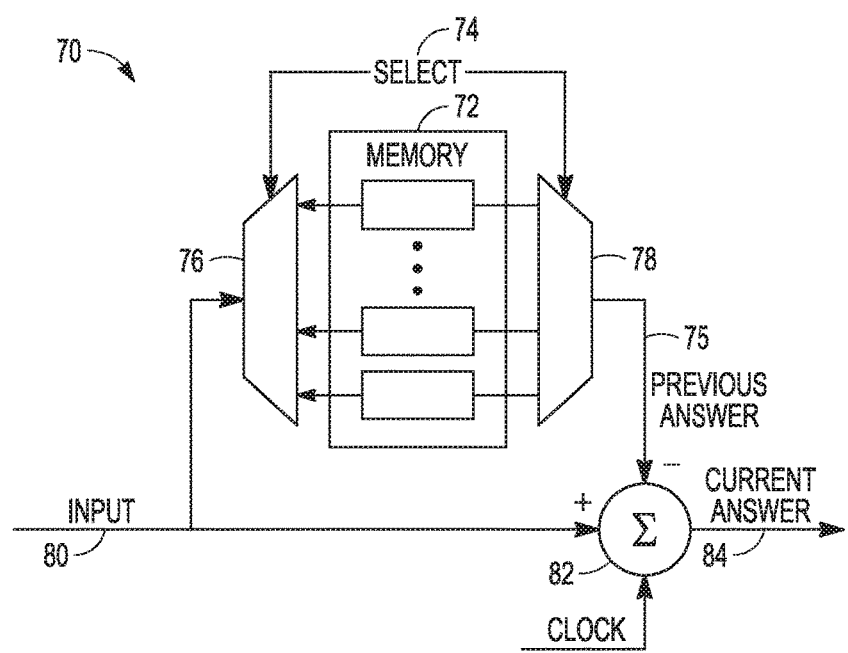
FIG. 7 is a block diagram of an example of a differentiator that can implement various techniques of this disclosure.

FIG. 7 is a block diagram of an example of a differentiator 70 that can implement various techniques of this disclosure. Integrators add a previous input to the current input and differentiators subtract the previous input from the current input. As such, the elements of a differentiator are similar to those of an integrator, except for the subtraction.

The differentiator 70 can include a memory circuit 72 that can store data from N previous states in memory elements 1 through storage element N. For example, memory element 1 can store/represent Chop0 phase(s) state and memory element 2 can store/represent Chop1 phase(s) state. This is not restricted to chop phases; memory elements may contain previous state data associated with different input channels to the ADC. The select signal 74 can control the chop phase selection. The differentiator 72 can include multiplexers 76, 78 that can receive the select signal 74 from a controller and select a particular state from the memory circuit 72. The differentiator 70 can receive an input signal 80, e.g., from the last integrator or a previous differentiator, receive the select signal 74, and preload the reference data from the memory circuit 72, e.g., the state of differentiator 1 of sample 12 in the non-limiting example shown in FIG. 4, and combine, e.g., subtract, the input data 80 and the preloaded reference data 75 using the summing circuit 82 to produce a current state or answer 84 that can be used by the controller to generate a filter output based on the combined sampled input data and preloaded reference data.

Figure 8:
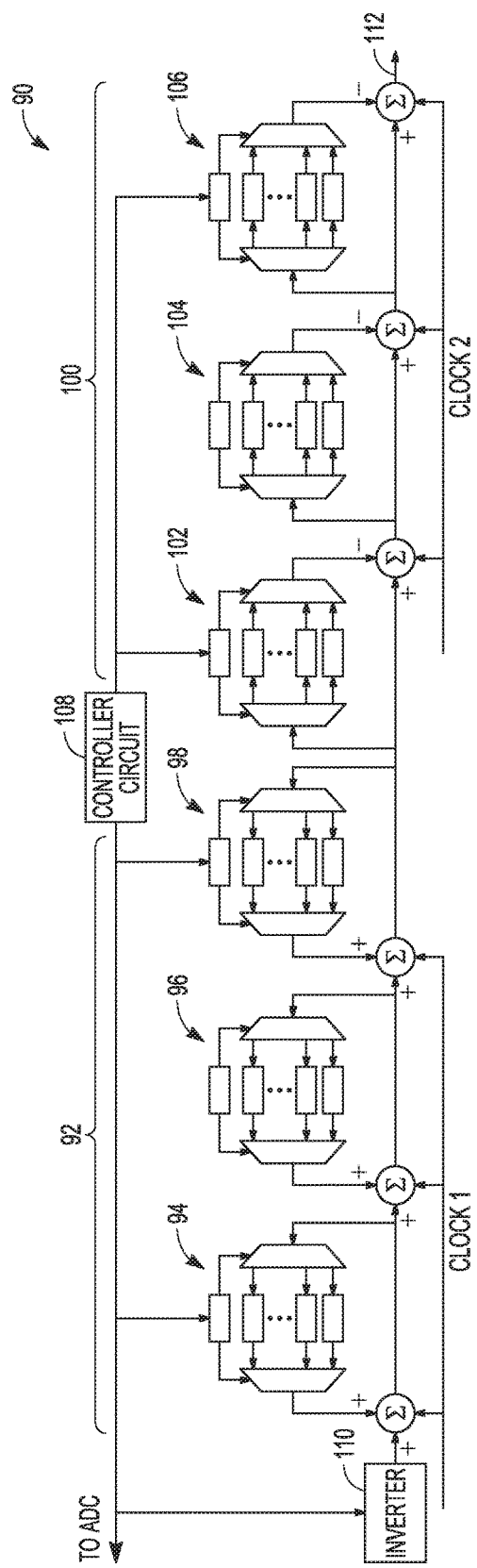
FIG. 8 is a block diagram an example of a filter that can be used to implement various techniques of this disclosure.

FIG. 8 is a block diagram an example of a filter circuit that can be used to implement various techniques of this disclosure. In the non-limiting example shown in FIG. 8, the filter circuit is a third order decimation filter, e.g., $Sinc^3$ decimation filter. The filter circuit 90 includes an integrator section 92 with integrators 94-98 and a differentiator section 100 with differentiators 102-106. The integrators 94-98 can be similar to integrators 40 and 60 in FIGS. 5 and 6, for example, and the differentiators 102-106 can be similar to differentiator 70 of FIG. 7, for example.

The integrator section 92 can receive a first clock signal "clock 1" and the differentiator section 100 can receive a second clock signal "clock 2". The "decimation" feature of the filter can be achieved by a controller 108 applying the clock signals "clock 1" and "clock 2" such that that there are different sampling rates between the integrator section 92 and the differentiator section 100. The controller circuit 108 can apply the select signals to the integrators 94-98 and to the differentiators 102-106 to select the respective memory circuits associated with the N stages of the filter circuit for retrieval and preloading of reference data, which can be applied to the summing circuits, as described above.

The filter circuit 90 can further include an inverter 110. The chop control circuitry of the controller circuit 108 can control the chop phase. The chop phase can control the inversion of the bit stream at the input of the filter, e.g., the sign of the respective chop phase data, by outputting a signal to the inverter 110 in FIG. 8. The chop phase also controls the polarity of the respective analog input signal to the ADC input. In addition, the signal from the controller circuit 108 controls the chopping operation of the ADC, for example, such that chopping in the filter is replicated on the analog signal passing through the ADC.

Using the inverter 110, the controller circuit 108 can apply a first chop phase to the sampled input data to generate first chop phase input data, determining a first set of reference data using the first chop phase input data and storing the reference data of the first set in respective first memory circuits associated with the N stages. Then, the controller circuit 108 can apply a second chop phase to the sampled input data to generate second chop phase input data and determine a second set of reference data using the second chop phase input data and storing the reference data of the second set in respective second memory circuits associated with the N stages.

The controller circuit 108 of the filter circuit 90 of FIG. 8 can generate a filter output 112 based on the combination of the sampled input data and the preloaded reference data.

Figure 9:
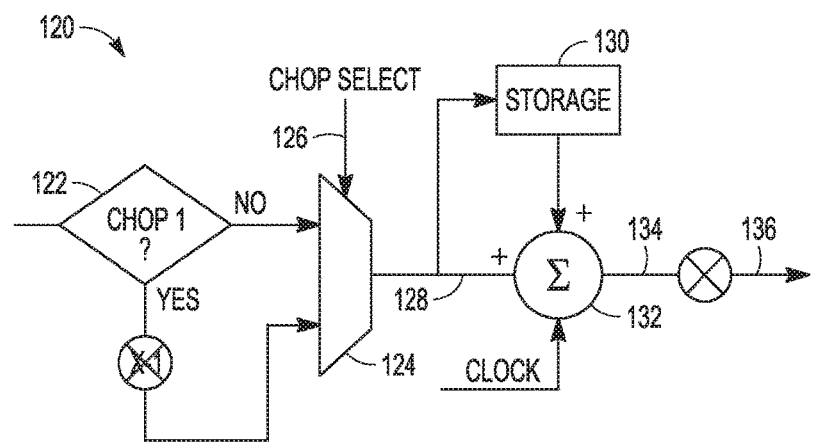
FIG. 9 is a block diagram of an example of an averaging circuit that can implement various techniques of this disclosure.

FIG. 9 is a block diagram of an example of an averaging circuit 120 that can implement various techniques of this disclosure. In some example implementations, the averaging circuit 120 can be coupled to the output of the filter circuit, e.g., filter circuit 90 in FIG. 8. The averaging circuit 120 can be used essentially to average by two each Chop0 and Chop1 fully settled outputs from the filter circuit, e.g., filter outputs of sample 12 and sample 24 in FIG. 4, to produce a fully chopped output.

In some example configurations, the settled Chop1 input can be subtracted from the Chop0 input and their sum can be divided by 2. This is because the polarity of the Chop1 data is negative by virtue of the fact that at the front end, e.g., of a modulator circuit in an analog-to-digital converter circuit, the input was flipped over, inverting the polarity.

The averaging circuit 120 can include a circuit 122 to receive the current input, e.g., from the last differentiator 106 in FIG. 8. Chop0 and Chop1 states can be applied to a multiplexer 124, which can be controlled using a chop select signal 126. The multiplexer 124 can output the filter output 128 corresponding to samples gathered during the relevant chop state, which can be stored in a memory circuit 130 and applied to a summing circuit 132. The input from the memory circuit 130 can assign the correct the sign (polarity) of the previous input. The output 134 of the summing circuit 132 can be applied to a divider circuit 132, e.g., divide by two, to generate the averaged output 136.

The implementations described above regarding providing an unchopped data output rate for a chopped configuration can utilize a "hybrid" approach in which the new techniques of this disclosure transition from existing approaches. However, the techniques of this disclosure are not limited to such "hybrid" approaches. Rather, as described below with respect to FIGS. 10-12, the new techniques can be executed from the start and thus can avoid the "hybrid" conversion results that use initially gathered data.

Figure 10:
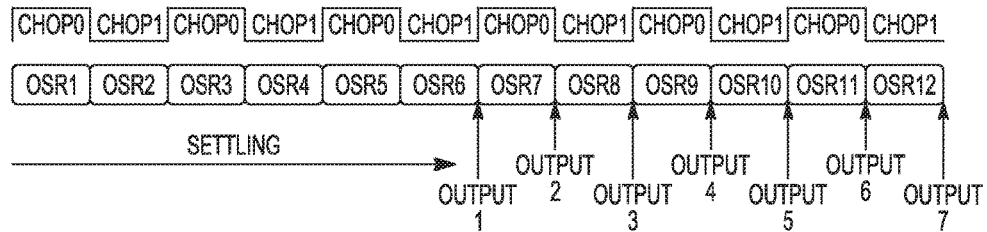
FIG. 10 is a conceptual diagram depicting another example of an unchopped data output rate for a chopped configuration with a third order Sinc decimation filter with an oversampling rate of OSR, in accordance with this disclosure.

FIG. 10 is a conceptual diagram depicting another example of an unchopped data output rate for a chopped configuration with a Sinc$^3$ decimation filter with an oversampling rate of OSR, in accordance with this disclosure. In FIG. 10, alternating chop phases can be applied, e.g., by the controller circuit 108 of FIG. 8 to the sampled input data at a rate of M. The filter circuit, e.g., filter circuit 90 of FIG. 8, can generate a first settled output based on a combination of the sampled input data and preloaded reference data at 2×(N×M), or OSR6 in this third order filter circuit. The controller circuit can repeat the preloading, sampling, and combining to generate another combination of sampled input data and preloaded reference data and generating subsequent filter outputs at each subsequent M. For example, as seen in FIG. 10, subsequent filter outputs can be generated at OSR7, OSR8, OSR9, and so forth.

Figure 11:
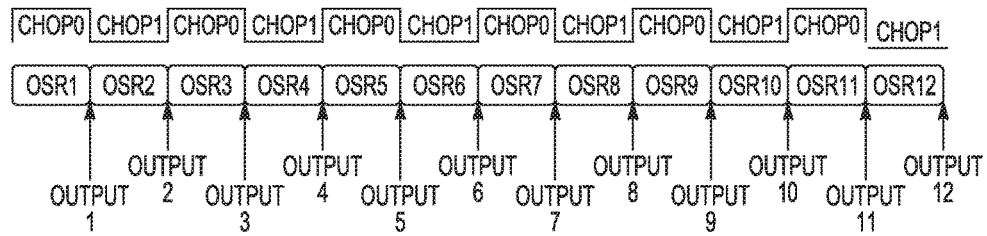
FIG. 11 is a conceptual diagram depicting another example of an unchopped data output rate for a chopped configuration with a Sinc decimation filter with an oversampling rate of OSR, in accordance with this disclosure.

FIG. 11 is a conceptual diagram depicting another example of an unchopped data output rate for a chopped configuration with a Sinc decimation filter with an oversampling rate of OSR, in accordance with this disclosure. Rather than waiting for all the outputs to be settled before allowing use of the data, in FIG. 10 unsettled outputs, e.g., any outputs before OSR6, can be used. In other words, data can be made available after the first OSR (OSR1). Although unsettled, it would still allow the use of a data point.

In FIG. 11, alternating chop phases can be applied, e.g., by the controller circuit 108 of FIG. 8 to the sampled input data at a rate of M. The filter circuit, e.g., filter circuit 90 of FIG. 8, can generate a first output (unsettled) based on a combination of the sampled input data and preloaded reference data at M, or OSR1 in this third order filter circuit. The controller circuit can repeat the preloading, sampling, and combining to generate another combination of sampled input data and preloaded reference data and generating subsequent filter outputs at each subsequent M. For example, as seen in FIG. 11, subsequent filter outputs can be generated at OSR2, OSR3, OSR4, and so forth. In this example, the first output will not have the unwanted Vos of the ADC removed as it is only based on the first Chop0 Phase data and there is no previous Chop1 phase data with which to cancel out Vos. But successive outputs can successfully remove Vos. The first output only having (1×OSR) data will be fully settled equivalent to a first order filter response and thus may not have sufficiently suppressed all noise, particularly quantization noise. As more OSR samples are taken the order of the filter can increase until the maximum N for a Sinc$^N$ filter. In some example implementations, an output of the Sinc$^N$ filter can be normalized to account for smaller output ranges, e.g., smaller output range of a Sinc$^1$ filter or Sinc$^2$ filter as compared to a Sinc$^3$ filter.

Figure 12:
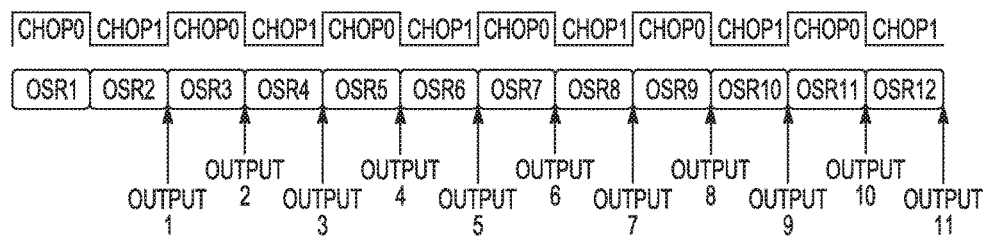
FIG. 12 is a conceptual diagram depicting another example of an unchopped data output rate for a chopped configuration with a Sinc decimation filter with an oversampling rate of OSR, in accordance with this disclosure.

FIG. 12 is a conceptual diagram depicting another example of an unchopped data output rate for a chopped configuration with a Sinc decimation filter with an oversampling rate of OSR, in accordance with this disclosure. Like in FIG. 11, rather than waiting for all the outputs to be settled before allowing use of the data, unsettled outputs, e.g., any outputs before OSR6, can be used. For example, data after OSR2 from a first order Sinc filter can be used. Here, unlike FIG. 11, the first output can have Vos removed as there is Chop0 and Chop1 phase data. The data will be fully settled equivalent to a 1$^{st}$ order filter response and thus may not have sufficiently suppressed all noise, particularly quantization noise. In other examples, data after OSR4 from a second order Sinc filter can be used, and so forth until the highest order filter has settled out.

In FIG. 12, alternating chop phases can be applied, e.g., by the controller circuit 108 of FIG. 8 to the sampled input data at a rate of M. The filter circuit, e.g., filter circuit 90 of FIG. 8, can generate a first fully chopped output based on a combination of the sampled input data and preloaded reference data at 2×N, or OSR2 in this first order filter circuit. The controller circuit can repeat the preloading, sampling, and combining to generate another combination of sampled input data and preloaded reference data and generating subsequent filter outputs at each subsequent M. For example, as seen in FIG. 12, subsequent filter outputs can be generated at OSR2, OSR3, OSR4, and so forth, with the order of the filtering increasing to the maximum N for a Sinc$^N$ filter, as the respective N×OSR samples are applied to the filter for each chop phase.

The techniques illustrated by the conceptual diagrams in FIGS. 10-12 can be implemented using the configurations shown in FIGS. 5-8, for example. To implement these techniques, the controller circuit 108 of FIG. 8 can further include chop control circuitry. In an example implementation in a sigma-delta modulator ADC, the length of the chop phases can be determined by the OSR. The chop control circuitry of the controller circuit 108 can control the chop phase. The chop phase can control the inversion of the bit stream at the input of the filter, e.g., the sign of the respective chop phase data, by outputting a signal to the inverter 110 in FIG. 8. The inversion control can be in sympathy with the inversion of the analog signal path that is being chopped.

In addition, the chop phase can control, e.g., using the select signals of FIGS. 5-7, the selection of the elements in the memory circuits for storage and retrieval of the stored historical data. The selection can be in sympathy with the respective chop phase.

Finally, the chop phase can control storing of the relevant filter outputs to be averaged over the last, at least two chop phases. It should be noted that if the sign is handled earlier by the inverter 110 of FIG. 8, then the back-end circuitry of the filter may not need the chop phase and can just average by two the last two filter outputs together with the sign assumed.

Figure 13:
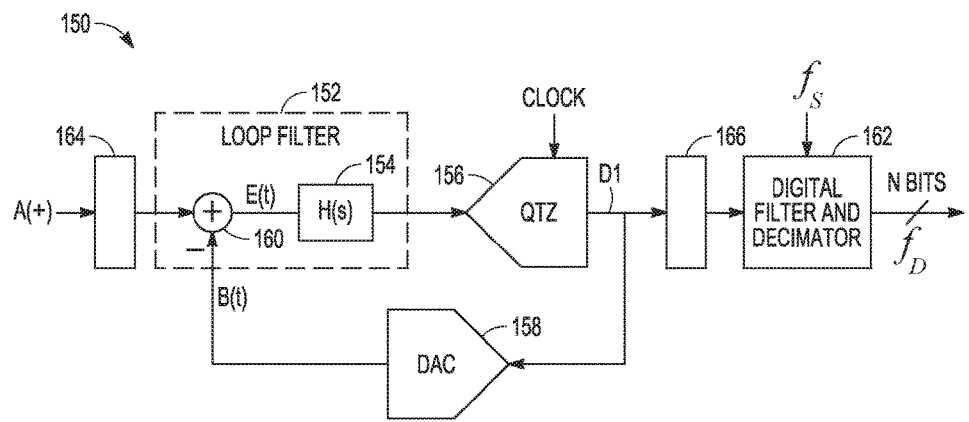
FIG. 13 depicts a block diagram of an example of an ADC that can implement various techniques of this disclosure.

FIG. 13 depicts a block diagram of an example of an ADC circuit 150 that can implement various techniques of this disclosure. In some examples, the ADC circuit 150 of FIG. 13 can be a continuous-time ΔΣ-ADC. The ADC circuit 150 of FIG. 13, shown receiving an analog input signal A(t) can include a continuous-time loop filter circuit 152. The loop filter circuit 152 can include at least one integrator or resonator circuit and can be described as a combination of transfer functions that result in a transfer function H(s) 154.

The ADC circuit 150 of FIG. 13 can include an K-bit quantizer (QTZ) circuit 156, e.g., where $1 \leq N \leq 5$, configured to receive an output C(t) of the loop filter circuit XX. In some examples, the K-bit quantizer circuit 156 can be implemented as a FLASH ADC due to the low number of bits required. The quantizer circuit 156 can generate a digital output D1.

The ADC circuit 150 of FIG. 13 can include a digital-to-analog converter (DAC) circuit 158 coupled to an output of the quantizer circuit 156 and connected in a feedback loop to an input of the loop filter circuit 152. In some examples, the output B(t) of the DAC circuit 158 can be subtracted from the analog input signal A(t) to generate the loop filter input E(t), as conceptually depicted by a subtractor circuit 160.

The ADC circuit 150 of FIG. 13 can include a digital filter and decimator circuit 162 sampled by a clock signal at frequency $f_s$ that can implement one or more of the techniques described above with respect to FIGS. 1-12. In some examples, the digital filter and decimator circuit 162 can be similar to filter circuit 90 of FIG. 8. In configurations with chopping, chops switches 164, 166 can be positioned at the input (before the loop filter circuit 152) and at the back end (before the digital filter and decimator 162), respectively. A controller circuit can control the chop switches and control operation of the digital filter.

Figure 14:
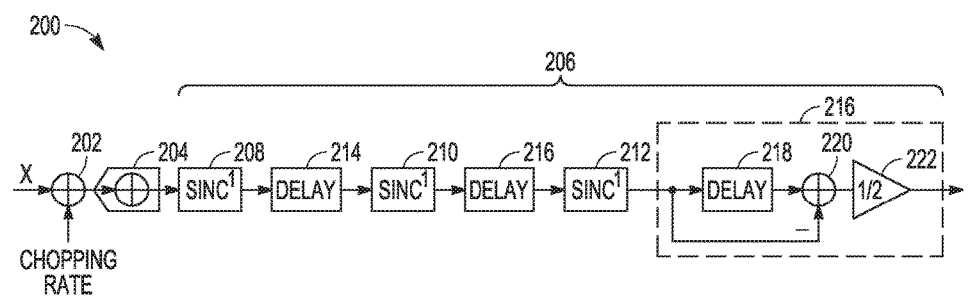
FIG. 14 is a block diagram illustrating another example of an ADC system that can implement various techniques of this disclosure.

FIG. 14 is a block diagram illustrating another example of an ADC system 200 that can implement various techniques of this disclosure. A chopper circuit 202 may chop an input analog signal X at a chopping rate "CR". In other words, the input analog signal X may be chopped such that each Chop0 and Chop1 phase has N=OSR samples. An ADC circuit 204 (e.g., a delta-sigma modulator) may input the chopped input analog signal and output an M-bit binary signal at its sampling rate. The outputs at each Sinc filter stage, e.g., filter stages 208, 210, 212, can be made available after 1×OSR samples. Note that the normalization factors were left out of FIG. 14 for simplicity.

A digital filter 206, e.g., the example filter circuit in FIG. 8, may receive the intermediate digital signal from the ADC circuit 204 and provide filtered outputs from the M-bit binary signal at the oversampling rate OSR, (e.g., the decimation rate). The oversampling rate OSR may be many times greater than the chopping rate $r_{2N}$, for example, a multiple of the chopping rate $r_{2N}$. The digital filter 206 may be a stable Finite Impulse Response (FIR) filter. The digital filter 206 may be an Nth order digital filter having N separate single stage filters coupled in series and separated by N−1 delay elements that delay the outputs of each single stage filter before passing them on to the next single stage filter.

As shown in FIG. 14, a Sinc$^3$ filter example of the digital filter 206 may include three single stage Sinc1 filters 208, 210, 212 separated by delay elements 214, 214. In an example, each of the Sinc1 filters 208, 210, 212 may have a Z-Domain transfer function represented by $(1-Z^{-N})/(1-Z^{-1})$, and each of the delay elements 212, 214 may have a Z-Domain transfer function represented by $Z^{-N}$. In various example implementations, other types and/or other orders of digital filters may be examples of the digital filter 206, and may be split into corresponding single stage filters coupled in series and separated by delay elements.

An averaging circuit 216 may compute a moving average of the filtered intermediate digital signal output by the digital filter 206 and output the moving average. In an example, the averaging circuit 216 may include a two-tap moving average circuit including a delay element 218 that receives the filtered intermediate digital signal from the digital filter 206 and a summing circuit 220 that combines a current value of the filtered intermediate digital signal from the digital filter 206 from a delayed value of the filtered intermediate digital signal from the delay element 218. The summing circuit 220 can sum positive and negative numbers. An output of the summing circuit 220 may be halved by a half-value circuit 222 and output from the averaging circuit 222 as a moving average signal. In various implementations, the averaging circuit 222 may have a different number of taps, e.g., a different number of delay elements coupled in series and a different number of inputs to the summing circuit 220, each of the inputs of the summing circuit 220 coming from an input to a respective one of the delay elements coupled in series.

In some examples, each of the single stage filters 208, 210, 212 may be implemented as a separate filter circuit, for example, in an integrated circuit, in various examples, a single filter circuit may be used to implement each of the single stage filters 208, 210, 212 with the single filter circuit taking turns performing the filtering function of each of the single stage filters 208, 210, 212.

Equation 1 illustrates an exemplary transfer function for an existing digital filter implemented as a single stage third order Sinc$^3$ filter with a triple delay register at the input of an averaging circuit, where N=OSR.

$$H_1(z) = \left(\frac{1-z^{-N}}{1-z^{-1}}\right)^3 \frac{1+z^{-3N}}{2} \quad \text{(Eq. 1)}$$
$$= \left(\frac{1-z^{-N}}{1-z^{-1}}\right)^3 \cdot H_{01}(z)$$

Equation 2 illustrates a transfer function for the digital filter 206 of FIG. 14 implemented as three separate stages of first order Sinc1 filters 208, 210, 212 with unit delay registers 214, 216 separating the separate single stage Sinc1 filters 208, 210, 212 and a unit delay register 218 at the input of the averaging circuit 216, where N=OSR.

$$H_2(z) = z^{-2N}\left(\frac{1-z^{-N}}{1-z^{-1}}\right)^3 \frac{1+z^{-N}}{2} \quad \text{(Eq. 2)}$$
$$= \left(\frac{1-z^{-N}}{1-z^{-1}}\right)^3 \cdot H_{02}(z)$$

Equation 3 illustrates the complex frequency response of an averaging circuit of an existing digital filter having the transfer function given in Eq. 1, where N=OSR. The group delay expressed in terms of samples at the sampling frequency $f_s$ is $n_1=3N/2$ samples. A notch of the frequency response of Eq. 3 is at $f_{01}=f_s/6N$.

$$H_{01}(\omega) = \frac{1+e^{-3Nj\omega}}{2} \Rightarrow \begin{cases} |H_{01}(\omega)| = \cos\frac{3N\omega}{2} \\ \arg\{H_{01}(\omega)\} = -\frac{3N\omega}{2} \end{cases} \quad \text{(Eq. 3)}$$

Equation 4 illustrates the complex frequency response of the averaging circuit 216 of the filter 206 in FIG. 14 having the transfer function given in Eq. 2, where N=OSR. The group delay expressed in terms of samples at the sampling frequency $f_s$ is $n_2=5N/2$ samples. A notch of the frequency response of Eq. 4 is at $f_{02}=f_s/2N$.

$$H_{02}(\omega) = e^{-2Nj\omega} \cdot \frac{1+e^{-Nj\omega}}{2} \Rightarrow \begin{cases} |H_{02}(\omega)| = \cos\frac{N\omega}{2} \\ \arg\{H_{01}(\omega)\} = -2N\omega - \frac{N\omega}{2} \end{cases} \quad \text{(Eq. 4)}$$

In conclusion, the new filter circuit 206 of FIG. 14 can result in an output data rate three times faster than the existing filter design, a notch at a frequency three times higher, and a latency of OSR samples longer. An example is shown in FIG. 15 for a Sinc$^3$ filter with sampling frequency fs=32.768 kHz and an OSR of 656.

Figure 15:
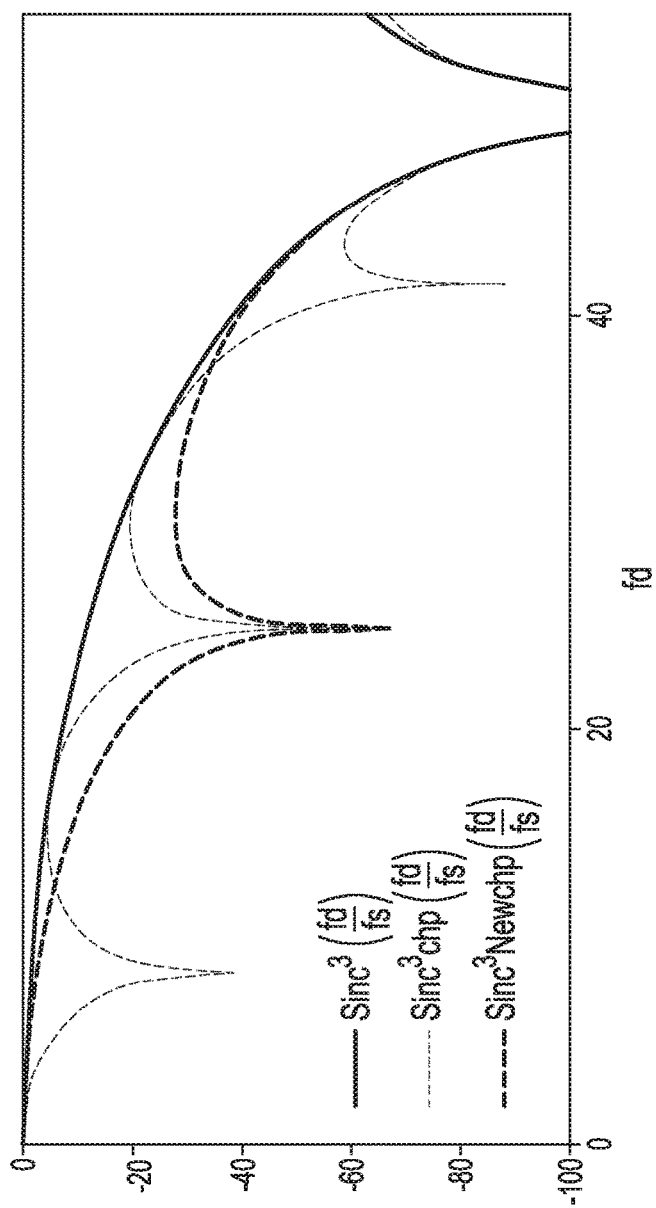
FIG. 15 illustrates a frequency response of a chopped distributed Sinc$^3$ filter corresponding to the example of the digital filter shown in FIG. 14 compared to an unchopped Sinc$^3$ filter implemented as a single stage third-order digital filter and a chopped Sinc$^3$ filter implemented as a single stage third-order digital filter, in accordance with this disclosure.

FIG. 15 illustrates a frequency response of a chopped distributed Sinc$^3$ filter corresponding to the embodiment of the digital filter 206 shown in FIG. 14 compared to an unchopped Sinc$^3$ filter implemented as a single stage third-order digital filter and a chopped Sinc$^3$ filter implemented as a single stage third-order digital filter, in accordance with this disclosure. In the embodiment of FIG. 15, the sampling frequency $f_s$=32.768 kHz and the oversampling rate OSR=656. Notches of the frequency response of the digital filter 206 are at $f_s$/2N=25 Hz and 50 Hz. Because the differences between the frequency responses are virtually negligible for 5 Hz or 1 Hz and below, examples as described herein are particularly well suited for applications with slowly changing inputs, for example, temperature and pressure sensors.

The digital filter 206 may provide N times the output data rate of the prior art in which the digital filter is implemented as a single Nth order digital filter.

Compared to an embodiment having a single stage Nth order digital filter, an embodiment having N stages of first order digital filters separated by unit delay elements may have greater storage space allocated for the unit delay elements. As process geometry decreases, any impact that the storage has on the area will be reduced. Furthermore, an embodiment as illustrated in FIG. 14 may utilize additional storage for the Sinc$^N$ filter to store alternate chop phase historical data, e.g., the delayed sample data sets from the last chop cycle. Thus, for a Sinc$^N$ filter distributed as illustrated in FIG. 14, N−1 additional sets of data may nominally be stored compared to an embodiment in which the Sinc$^N$ filter is implemented as a single stage Nth order Sinc$^N$ filter.

Figure 16A:
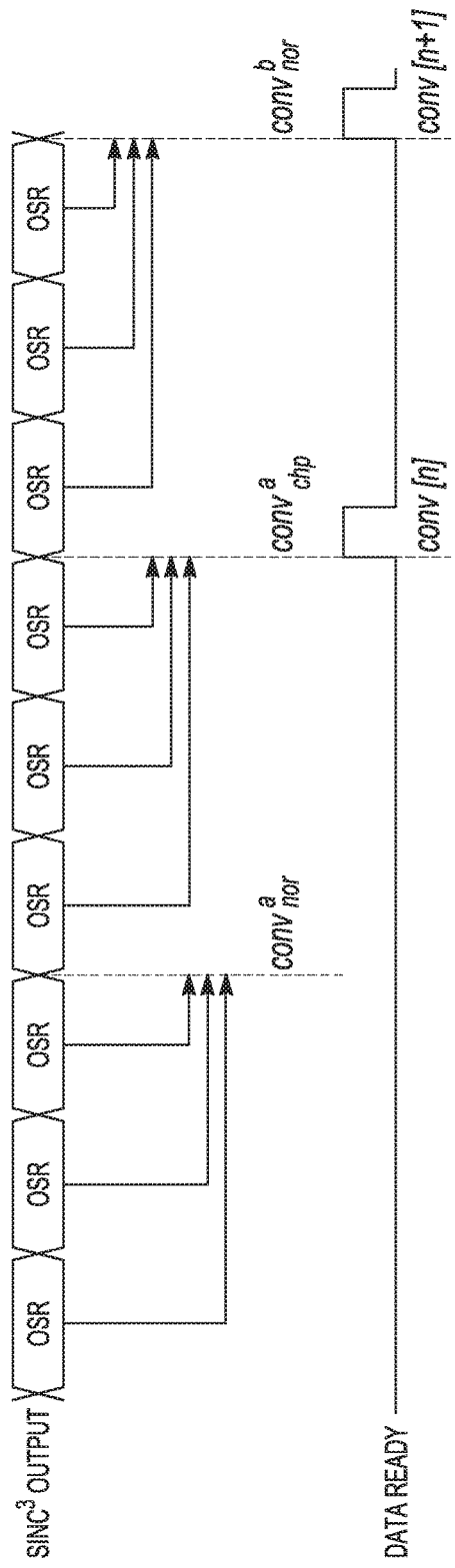
FIG. 16A is a timing diagram illustrating an example of a timing of converted output data availability relative to a number of analog input samples equal to the oversampling rate OSR being filtered and a chop phase.

FIG. 16A is a timing diagram illustrating an example of a timing of converted output data availability relative to a number of analog input samples equal to the oversampling rate OSR being filtered and a chop phase using one approach. In particular, FIG. 16A depicts a timing diagram of one approach to a Sinc$^3$ filter with system chop. Two consecutive settled conversions are needed for each chopped conversion. The output data rate (ODR)=$f_s$/(3×OSR) and the chopped conversion result uses (6×OSR) previous modulator outputs for the approach shown in FIG. 16A.

Figure 16B:
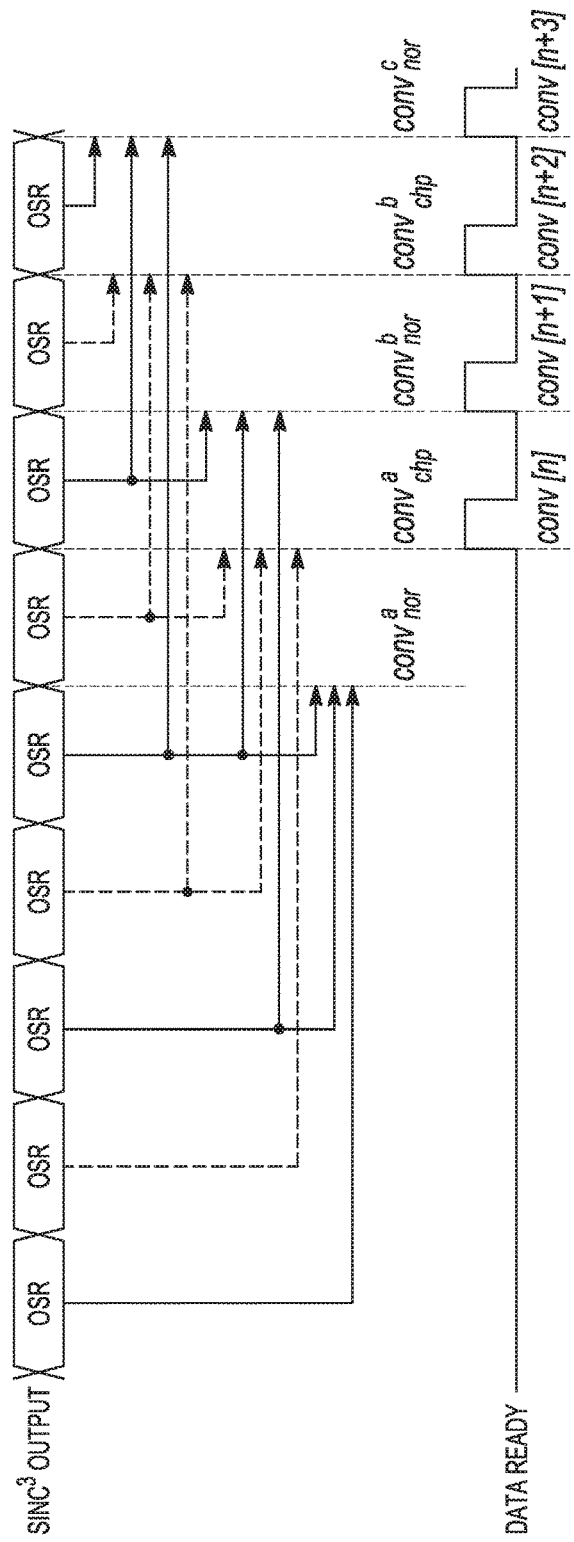
FIG. 16B is a timing diagram illustrating another example of a timing of converted output data availability relative to a number of analog input samples equal to the oversampling rate OSR being filtered and a chop phase, in accordance with this disclosure.

FIG. 16B is a timing diagram illustrating another example of a timing of converted output data availability relative to a number of analog input samples equal to the oversampling rate OSR being filtered and a chop phase, in accordance with this disclosure. Because the filter is a chopped Sinc$^3$ filter, a first fully settled chopped output may not be available until after six cycles. However, due to the methods employed as described in this disclosure, a fully settled chopped output may be available at each cycle thereafter. The output data rate (ODR) of the example illustrated in FIG. 14 may be given as ODR=$f_s$/OSR. Compared to the traditional approach, there may be a bandwidth increase, e.g., of 3×.

In traditional filtering schemes, the same N integrators/differentiators can be used for both Chop0 and Chop1 phases because the data is sequentially and consecutively sampled from the same input signal until the filter is fully settled. Thus, the chop phase is fixed for the full filter settling time, so the memory circuits in the integrators and differentiators of the filter are naturally flushed. In contrast, in the embodiment of FIG. 14, respective chop phase data is gathered sequentially over multiple OSR phases. Thus, after each N=OSR samples, the filter elements may be preloaded with their states from the last corresponding chop phase.

In various examples, a plurality of Sinc filters may be implemented in parallel for data samples associated with each chop phase. Also, since examples as disclosed herein effectively increase a chop rate compared to traditional ADC systems employing a single stage Nth order filter, there may be an increase of chop transitions across a weighting profile of the filter. Timing of chop phases with respect to analog sampling and balancing filter weighting applied to each chop phases may address issues related to this, for example, as outlined in US 2005/0156769 by O'Dowd.

In some approaches to ADC systems, when system chopping is enabled, a modulator reset of the delta-sigma modulator ADC circuit may be performed by discharging integrator capacitors. This modulator reset may be performed at each chop edge, or transition from one chop phase to another chop phase (e.g., Chop0 to Chop1 and vice versa). In the embodiment of FIG. 1, the modulator reset may also be performed N times more frequently for a Sinc$^N$ filter than in traditional ADC systems using a Sinc$^N$ filter. As a result, consideration may need to be given to the settling of the analog signal inputs after the front-end chop circuit. Potential error resulting from an accumulation of unsettled samples may be more apparent than in traditional systems; however, this may not be a problem because traditionally, the first few modulator cycles may be deliberately ignored (e.g., blanking).

Figure 17:
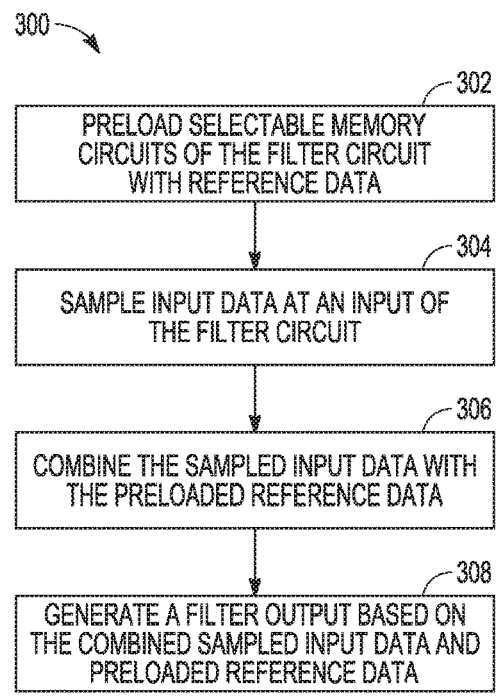
FIG. 17 is a flow diagram that illustrates an example of a method to reduce a settling time of a filter circuit, in accordance with this disclosure.

FIG. 17 is a flow diagram that illustrates an example of a method 300 to reduce a settling time of a filter circuit, in accordance with this disclosure. At block 302, the method 300 can include preloading selectable memory circuits of the filter circuit with reference data. For example, the controller circuit 108 of the filter circuit 90 of FIG. 8 can control one or more or the integrators 94-98 select a memory circuit of and preload the memory circuits with past data. In some examples, the controller circuit can align the input data or channel with the appropriate preloaded reference data. That is, the controller circuit 108 can receive a signal to select particular reference data associated with a previous input configuration, e.g., one of multiple inputs channels or a chop state of an input channel, to preload. In some examples, the signal can be a chop signal or a chop phase, e.g., binary signal. In some examples, the previous input configuration can be one of a number of channels of an input multiplexer circuit that are not chopped. In some examples, the previous input configuration can be one of a number of input channels' respective chop phase data where that input channel is chopped.

At block 304, the method 300 can include sampling input data at an input of the filter circuit. For example, the controller circuit 108 of the filter circuit 90 of FIG. 8 can control integrator 40 of FIG. 5, for example, to sample input data 48.

At block 306, the method 300 can include combining the sampled input data with the preloaded reference data. For example, the controller circuit 108 of the filter circuit 90 of FIG. 8 can control integrator 40 of FIG. 5, for example, to combine, using summing circuit 52, combining the sampled input data 48 with the preloaded reference data 45. At block 308, the method 300 can include generating a filter output based on the combined sampled input data and preloaded reference data. For example, the controller circuit 108 of the filter circuit 90 of FIG. 8 can generate a filter output 112 based on the combined sampled input data and preloaded reference data.

In some example configurations, an ADC circuit can be coupled to an input multiplexer circuit and can receive input signals from one of many input channels fed into the multiplexer circuit. Such a configuration can be referred to as a multiple input switched ADC.

In such a configuration, one drawback can be that as the input channels are switched, there is a delay to allow for full filter settling for each successive channel conversion result. A delay can be a potential issue for sigma-delta based ADCs that have a digital filter because the data is flushed through the digital filter each time a new channel is selected. As an example, even if chopping is not enabled, each new channel selected requires 3×OSR samples to settle for a $Sinc^3$ filter.

Using the techniques of this disclosure, allowing for the retention of per channel data, like the chop scheme described above, can similarly allow faster output data rates to be achieved while switching through the channel inputs. The chop phases described above can be considered pseudo channels, for example, where a Chop0 phase and a Chop1 phase are two signal inputs. As such, a system that includes Chop0 and Chop1 phases can be considered a simple two channel input system with the Chop0 phase being a pseudo Channel 1 and the Chop1 phase being a pseudo Channel 2. Moreover, where those input channels are chopped, consideration i.e. additional memory elements, can be allocated for the respective Chop0 and Chop1 chopping phases of Pseudo Channel 0 and Pseudo Channel 1.

As described above, a controller circuit can align the respective Pseudo channel and respective chop phase data, where relevant, to the current sampled input and its respective historical preloaded data. These techniques can be extended to include multiple channel inputs of a multiplexed ADC system as shown in FIG. 18.

For example, when switching between channels for a multi-channel multiplexing ADC, the system would normally have to wait several OSRs, e.g., 3 OSRs for a $Sinc^3$ filter, to get an output for Channel 1, and then the system moves to Channel 2 and needs to wait several OSRs again, etc. However, using the techniques described above, the data from previous cycles is stored in memory associated with the channels and can be preloaded as described above to increase the data throughput rate of the filter circuit. This can allow the multi-channel multiplexing ADC to circulate through the channels much more quickly.

Figure 18:
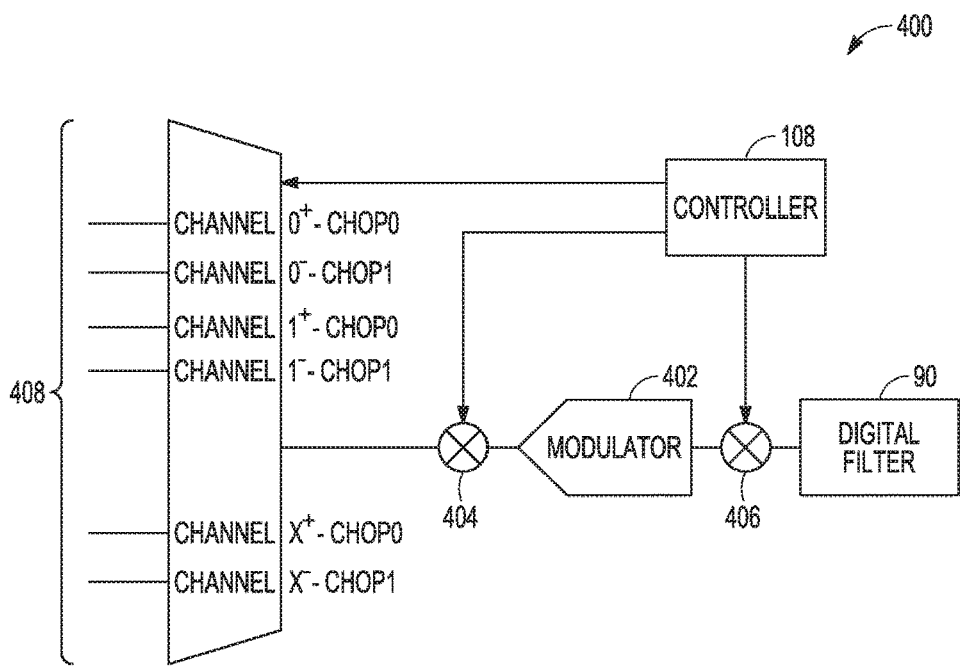
FIG. 18 is a block diagram of an example of a multiplexed ADC system that can implement various techniques of this disclosure.

FIG. 18 is a block diagram of an example of a multiplexed ADC system that can implement various techniques of this disclosure. The ADC system 400 of FIG. 18 can include a modulator circuit 402, e.g., delta-sigma modulator circuit, coupled between a chop switch 404 and a de-chop switch 406. The output of the de-chop switch can provide input data to the digital filter circuit 90, which is described in detail above. A controller circuit 108 can control operation of the digital filter circuit 90 and the switches 404, 406, as described above.

In addition, the ADC system 400 can include a multiplexer circuit 408 to receive a plurality of inputs signal on channels 0-X, and, in implementations that utilize chopping, a chop phase associated with each of the channels. The controller circuit 108 can further control the multiplexer circuit 408. The controller circuit 108 can select the respective input channel, chop phase, and respective preloaded data for each channel to generate that particular channel's next output. In this way, the channel switching can operate are a rate of "every OSR samples", an advantage for unchopped as well as chopped multiplexed switching.

Using techniques similar to those described above, the ADC system 400 can preload selectable memory circuits of the filter circuit 90 with reference data, sample input data at an input of the filter circuit, e.g., after the de-chop switch 406, combine the sampled input data with the preloaded reference data, and generate a filter output based on the combined sampled input data and preloaded reference data. The filter circuit 90 can have N stages, where the N stages are associated with respective selectable memory circuits.

In some examples, preloading the selectable memory circuits of the filter circuit with reference data can include selecting the respective memory circuits associated with the N stages and retrieving the reference data from the selected memory circuits. The controller circuit 108 can apply a first input channel selection to receive input data from a first channel of a plurality of input channels, e.g., a channel of channels 0-X of multiplexer circuit 408. The controller circuit 108 can store the input data for the first input channel in respective memory circuits associated with the first input channel. Then, the controller circuit 108 can apply a second input channel selection to receive input data from a second input channel, and store the input data for the second input channel in respective memory circuits associated with the second channel.

In some example implementations, chopping can be combined with multi-channel multiplexing techniques. For example, the controller circuit 108 can apply a first chop phase to a first input channel sampled input data to generate first chop0 phase input data for the first input channel, determine a first set of reference data using the first input channel sampled chop0 phase input data, and store the first set of reference data in respective first memory circuits associated with the N stages. Then, the controller circuit 108 can apply a second chop phase to the first input channel sampled input data to generate chop1 phase input data for the first input channel, and determine a second set of reference data using the chop1 phase input data, and store the second set of reference data in respective second memory circuits associated with the N stages.

The controller circuit 108 can apply the first chop phase to a second input channel sampled input data to generate first chop0 phase input data for the second input channel, determine a third set of reference data using the second input channel sampled chop0 phase input data, and store the third set of reference data in respective third memory circuits associated with the N stages. The controller circuit 108 can apply the second chop phase to the second channel sampled input data to generate chop1 phase input data for the second input channel, determine a fourth set of reference data using the second input channel sampled input chop1 phase input data, and store the fourth set of reference data in respective fourth memory circuits associated with the N stages.

More particularly, the controller circuit 108 can apply, e.g., conditionally apply, a first chop phase, e.g., using switches 404 (or the input mux), 406, to a sampled input data of the first channel to generate first chop phase input data. The controller circuit 108 can determine a first set of reference data using the sampled input data of the first channel and store the first set reference data in respective first memory circuits associated with the N stages.

Similarly, the controller circuit 108 can apply a second input channel selection to receive input data from a second channel of a plurality of input channels, e.g., another channel of channels 0-X of multiplexer circuit 408. The controller circuit 108 can apply, e.g., conditionally apply, a second chop phase, e.g., using switches 404 (or the input mux), 406, to a sampled input data of the second channel to generate second chop phase input data. The controller circuit 108 can determine a second set of reference data using the sampled input data of the second channel and store the second set reference data in respective first memory circuits associated with the N stages.

In some implementations, both chop0 and chop1 phase data can be gathered on a channel before moving to the next channel. In other implementations, the multi-channel ADC can sweep channel 0 to channel N chop0 phase, and then sweep channel 0 to N chop1 phase.

By repeating the input channel selection, sampling, and storing (and chopping, if used) the ADC system 400 can generate other combinations of sampled input data and reference data associated with the other inputs to the digital filter.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. A method of increasing a data throughput rate of a digital filter circuit, the digital filter circuit including one or more of an integrator circuit and a differentiator circuit, wherein each integrator circuit and differentiator circuit includes two or more selectable memory circuits configured to store data, the method comprising:
    selecting a first one of the selectable memory circuits of the integrator circuit or the differentiator circuit and preloading the first one of the selectable memory circuits with reference data stored in a second one of the selectable memory circuits;
    sampling input data at an input of the digital filter circuit;
    combining the sampled input data with the preloaded reference data; and
    generating a filter output based on the combined sampled input data and preloaded reference data.

2. The method of claim 1, wherein the filter circuit has N stages, and wherein the N stages are associated with respective selectable memory circuits, the method further comprising:
    determining the reference data using previously sampled input data associated with a previous input configuration and storing the reference data in the respective selectable memory circuits associated with the N stages,
    wherein selecting the first one of the selectable memory circuits of the integrator circuit or the differentiator circuit and preloading the first one of the selectable memory circuits with reference data stored in the second one of the selectable memory circuits includes:
    selecting the respective memory circuits associated with the N stages; and retrieving the reference data from the selected memory circuits.

3. The method of claim 2, wherein the previous input configuration includes a chop phase, and wherein determining the reference data using previously sampled input data associated with a previous input configuration and storing the reference data in the respective selectable memory circuits associated with the N stages further includes:
applying a first chop phase to the sampled input data to generate first chop phase input data;
determining a first set of reference data using the first chop phase input data and storing the reference data of the first set in respective first memory circuits associated with the N stages;
applying a second chop phase to the sampled input data to generate second chop phase input data; and
determining a second set of reference data using the second chop phase input data and storing the reference data of the second set in respective second memory circuits associated with the N stages.

4. The method of claim 1, wherein sampling input data at an input of the filter circuit includes:
applying a first input channel selection to receive input data from a first channel of a plurality of input channels;
storing the input data for the first input channel in respective memory circuits associated with the first input channel;
applying a second input channel selection to receive input data from a second input channel; and
storing the input data for the second input channel in respective memory circuits associated with the second channel.

5. The method of claim 4, wherein the filter circuit has N stages, and wherein the N stages are associated with respective selectable memory circuits, the method further comprising:
applying a first chop phase to a first input channel sampled input data to generate first chop0 phase input data for the first input channel;
determining a first set of reference data using the first input channel sampled chop0 phase input data and storing the first set of reference data in respective first memory circuits associated with the N stages;
applying a second chop phase to the first input channel sampled input data to generate chop1 phase input data for the first input channel; and
determining a second set of reference data using the chop1 phase input data and storing the second set of reference data in respective second memory circuits associated with the N stages.

6. The method of claim 1, wherein the filter circuit has N stages, wherein the filter has an oversampling rate (OSR) of M, and wherein generating the filter output based on the combined sampled input data and preloaded reference data includes:
applying alternating chop phases to the sampled input data at a rate of M;
generating a first filter output based on the combined sampled input data and preloaded reference data at $2\times(N\times M)$, the method further comprising:
repeating the preloading, sampling, and combining to generate another combination of sampled input data and preloaded reference data; and
generating subsequent filter outputs at each subsequent M.

7. The method of claim 1, wherein the filter circuit has N stages, wherein the filter has an oversampling rate (OSR) of M, and wherein generating the filter output based on the combined sampled input data and preloaded reference data includes:
applying alternating first chop phases to the sampled input data at a rate of $(N\times M)$;
generating the first chopped filter output using the third chopped input signal and the preloaded first set of data of a filter state at $2\times(N\times M)$, the method further comprising:
applying alternating second chop phases to the sampled input data at a rate of M;
repeating the preloading, sampling, and combining to generate another combination of sampled input data and preloaded reference data; and
generating a second chopped filter output using another chopped input signal and a preloaded second set of data of a filter state at a subsequent M.

8. The method of claim 1, further comprising:
generating the input data at the input of the filter circuit using a delta-sigma analog-to-digital converter.

9. An analog-to-digital converter (ADC) circuit for increasing a data throughput rate of a filter, the ADC circuit comprising:
a digital filter circuit configured to receive input data at an input, the digital filter circuit including N filter stages, wherein each of the N filter stages includes one or more of an integrator circuit and a differentiator circuit, wherein each integrator circuit and differentiator circuit includes two or more selectable memory circuits configured to store data;
a controller circuit coupled to the digital filter circuit and configured to:
select a first one of the selectable memory circuits of the integrator circuit or the differentiator circuit and preload the first one of the selectable memory circuits with reference data stored in a second one of the selectable memory circuits;
sample the input data at the input of the digital filter circuit;
combine the sampled input data with the preloaded reference data; and
generate a filter output based on the combined sampled input data and preloaded reference data.

10. The ADC circuit of claim 9, wherein the controller circuit is configured to:
determine the reference data using previously sampled input data associated with a previous input configuration and store the reference data in the respective selectable memory circuits associated with the N stages, and
wherein the controller circuit configured to select the first one of the selectable memory circuits of the integrator circuit or the differentiator circuit and preload the first one of the selectable memory circuits with reference data stored in a second one of the selectable memory circuits is further configured to:
select the respective memory circuits associated with the N stages; and
retrieve the reference data from the selected memory circuits.

11. The ADC circuit of claim 10, wherein the previous input configuration includes a chop phase, and wherein the controller circuit configured to:
determine the reference data using previously sampled input data associated with a previous input configuration and store the reference data in the respective selectable memory circuits associated with the N stages is configured to:
apply a first chop phase to the sampled input data to generate first chop phase input data,
determine a first set of reference data using the first chop phase input data and storing the reference data of the first set in respective first memory circuits associated with the N stages;
apply a second chop phase to the sampled input data to generate second chop phase input data; and
determine a second set of reference data using the second chop phase input data and store the reference data of the second set in respective second memory circuits associated with the N stages.

12. The ADC circuit of claim 9, wherein the filter has an oversampling rate (OSR) of M, and wherein the controller circuit configured to generate the filter output based on the combined sampled input data and preloaded reference data is configured to:
apply alternating chop phases to the sampled input data at a rate of M;
generate a first filter output based on the combined sampled input data and preloaded reference data at 2×(N×M),
the controller circuit further configured to:
repeat the preloading, sampling, and combining to generate another combination of sampled input data and preloaded reference data; and
generate subsequent filter outputs at each subsequent M.

13. The ADC circuit of claim 9, wherein the filter has an oversampling rate (OSR) of M, and wherein the controller circuit configured to generate the filter output based on the combined sampled input data and preloaded reference data is configured to:
apply alternating first chop phases to the sampled input data at a rate of (N×M);
generate the first chopped filter output using the third chopped input signal and the preloaded first set of data of a filter state at 2×(N×M),
the controller circuit further configured to:
apply alternating second chop phases to the sampled input data at a rate of M;
repeat the preloading, sampling, and combining to generate another combination of sampled input data and preloaded reference data; and
generate a second chopped filter output using another chopped input signal and a preloaded second set of data of a filter state at a subsequent M.

14. The ADC circuit of claim 9, wherein the ADC circuit includes a delta-sigma ADC circuit.

15. An analog-to-digital converter (ADC) circuit for increasing a data throughput rate of a digital filter circuit, the digital filter circuit including one or more of an integrator circuit and a differentiator circuit, wherein each integrator circuit and differentiator circuit includes two or more selectable memory circuits configured to store data, the ADC circuit comprising:
means for selecting a first one of the selectable memory circuits of the integrator circuit or the differentiator circuit and preloading the first one of the selectable memory circuits with reference data stored in a second one of the selectable memory circuits;
means for sampling input data at an input of the digital filter circuit;
means for combining the sampled input data with the preloaded reference data; and
means for generating a filter output based on the combined sampled input data and preloaded reference data.

16. The ADC circuit of claim 15, wherein the filter circuit has N stages, and wherein the N stages are associated with respective selectable memory circuits, the circuit further comprising:
means for determining the reference data using previously sampled input data associated with a previous input configuration and storing the reference data in the respective selectable memory circuits associated with the N stages,
wherein the means for selecting the first one of the selectable memory circuits of the integrator circuit or the differentiator circuit and preloading the first one of the selectable memory circuits with reference data stored in the second one of the selectable memory circuits includes:
means for selecting the respective memory circuits associated with the N stages; and
means for retrieving the reference data from the selected memory circuits.

17. The ADC circuit of claim 16,
wherein the previous input configuration includes a chop phase, and wherein the means for determining the reference data using previously sampled input data associated with a previous input configuration and storing the reference data in the respective selectable memory circuits associated with the N stages further includes:
means for applying a first chop phase to the sampled input data to generate first chop phase input data;
means for determining a first set of reference data using the first chop phase input data and storing the reference data of the first set in respective first memory circuits associated with the N stages;
means for applying a second chop phase to the sampled input data to generate second chop phase input data; and
means for determining a second set of reference data using the second chop phase input data and storing the reference data of the second set in respective second memory circuits associated with the N stages.

18. The ADC circuit of claim 15, wherein the means for sampling input data at an input of the filter circuit includes:
means for applying a first input channel selection to receive input data from a first channel of a plurality of input channels;
means for storing the input data for the first input channel in respective memory circuits associated with the first input channel;
means for applying a second input channel selection to receive input data from a second input channel; and
means for storing the input data for the second input channel in respective memory circuits associated with the second channel.

19. The ADC circuit of claim 18, wherein the filter circuit has N stages, and wherein the N stages are associated with respective selectable memory circuits, the circuit further comprising:
means for applying a first chop phase to a first input channel sampled input data to generate first chop0 phase input data for the first input channel;
means for determining a first set of reference data using the first input channel sampled chop0 phase input data and storing the first set of reference data in respective first memory circuits associated with the N stages;

means for applying a second chop phase to the first input channel sampled input data to generate chop1 phase input data for the first input channel; and means for determining a second set of reference data using the chop1 phase input data and storing the second set of reference data in respective second memory circuits associated with the N stages.

20. The ADC circuit of claim 15, wherein the filter circuit has N stages, wherein the filter has an oversampling rate (OSR) of M, and wherein the means for generating the filter output based on the combined sampled input data and preloaded reference data includes:

means for applying alternating chop phases to the sampled input data at a rate of M;

means for generating a first filter output based on the combined sampled input data and preloaded reference data at 2×(N×M), the circuit further comprising:

means for repeating the preloading, sampling, and combining to generate another combination of sampled input data and preloaded reference data; and means for generating subsequent filter outputs at each subsequent M.

\* \* \* \* \*